(12) United States Patent
Chung

(10) Patent No.: US 11,188,417 B2
(45) Date of Patent: Nov. 30, 2021

(54) MEMORY SYSTEM, MEMORY MODULE, AND OPERATION METHOD OF MEMORY SYSTEM

(71) Applicant: SK hynix Inc., Gyeonggi-do (KR)

(72) Inventor: Hoiju Chung, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 203 days.

(21) Appl. No.: 16/677,362

(22) Filed: Nov. 7, 2019

(65) Prior Publication Data

US 2020/0142772 A1 May 7, 2020

Related U.S. Application Data

(60) Provisional application No. 62/756,912, filed on Nov. 7, 2018.

(51) Int. Cl.
*H03M 13/00* (2006.01)
*G06F 11/10* (2006.01)
*G06F 9/48* (2006.01)
*H03M 13/11* (2006.01)

(52) U.S. Cl.
CPC ........ *G06F 11/1068* (2013.01); *G06F 9/4881* (2013.01); *G06F 11/102* (2013.01); *G06F 11/1004* (2013.01); *G06F 11/1044* (2013.01); *H03M 13/116* (2013.01); *H03M 13/118* (2013.01)

(58) Field of Classification Search
CPC ............. G06F 11/1068; G06F 11/1004; G06F 11/102; G06F 11/1044; G06F 11/1076; G06F 11/1008; G06F 11/10; G06F 9/4881; H03M 13/116; H03M 13/118
See application file for complete search history.

(56) References Cited

U.S. PATENT DOCUMENTS

| 9,563,502 | B1 | 2/2017 | Alhussien et al. |
| 2012/0173936 | A1* | 7/2012 | Johnson .............. G06F 11/1044 714/718 |
| 2016/0117221 | A1* | 4/2016 | Nair ...................... G06F 11/108 714/764 |
| 2018/0143876 | A1* | 5/2018 | Yang ...................... G11C 16/10 |

* cited by examiner

*Primary Examiner* — Christine T. Tu
(74) *Attorney, Agent, or Firm* — IP & T Group LLP

(57) ABSTRACT

An operation method of a memory system including a memory controller and a memory device may include transferring, by the memory controller, a first read command to the memory device; transferring, by the memory device, read data and a part of an error correction code corresponding to the read data to the memory controller in response to the first read command; detecting, by the memory controller, an error of the read data based on the part of the error correction code; transferring, by the memory controller, a second read command to the memory device when the error is detected; transferring, by the memory device, a remainder of the error correction code corresponding to the read data to the memory controller in response to the second read command; and correcting, by the memory controller, the error of the read data based on the remainder of the error correction code.

22 Claims, 7 Drawing Sheets

MEMORY SYSTEM, MEMORY MODULE, AND OPERATION METHOD OF MEMORY SYSTEM

CROSS-REFERENCE TO RELATED APPLICATION

This application claims priority of U.S. Provisional Application No. 62/756,912, filed on Nov. 7, 2018, which is incorporated herein by reference in its entirety.

BACKGROUND

1. Field

Various embodiments of the present invention relate generally to a memory system. More particularly, the present invention relates to a memory system and an operating method thereof capable of reducing current consumption while increasing the efficiency of data error correction.

2. Discussion of the Related Art

In the initial stages of a semiconductor memory industry, a plurality of original good dies having no failed memory cells in a memory chip which passed through a semiconductor fabrication process were distributed on a wafer. However, as the capacity of a memory device gradually increases, it has become difficult to fabricate a memory device having no failed memory cells and at present, there is almost no possibility that such a memory device will be fabricated. Various methods for overcoming this problem, include replacing detecting the failed memory cells of a memory device and replacing them with redundancy memory cells.

Other methods include employing an error correction circuit (ECC) that corrects errors occurring in memory cells and errors occurring when data is transmitted during read and write operations of a memory system. However, despite the significant advances accomplished, continuous demand for smaller, more reliable memory systems requires new improved ways to correct errors in data processing.

SUMMARY

Various embodiments of the present invention are directed to an improved memory system technology that is capable of reducing current consumption while at the same time increasing the efficiency of error correction in a memory system.

In an embodiment, an operation method of a memory system including a memory controller and a memory device may include: transferring, by the memory controller, a first read command to the memory device; transferring, by the memory device, read data and a part of an error correction code corresponding to the read data to the memory controller in response to the first read command; detecting, by the memory controller, an error of the read data based on the part of the error correction code; transferring, by the memory controller, a second read command to the memory device when the error is detected; transferring, by the memory device, a remainder of the error correction code corresponding to the read data to the memory controller in response to the second read command; and correcting, by the memory controller, the error of the read data based on the remainder of the error correction code.

In an embodiment, a memory system may include: a memory device configured to output read data and a part of an error correction code corresponding to the read data in response to a first read command, and to output a remainder of the error correction code corresponding to the same read data in response to a second read command; and a memory controller configured to detect an error of the read data based on the part of the error correction code outputted from the memory device corresponding to the first read command, and to apply the second read command to the memory device when the error is detected.

In an embodiment, a memory module may include: at least one first memory chip configured to store data and a part of an error correction code corresponding to the data; and at least one second memory chip configured to store a remainder of the error correction code corresponding to the data, wherein the at least one first memory chip and the at least one second memory chip share a command, wherein, when a first read command is applied to the at least one first memory chip and the at least one second memory chip, the at least one first memory chip performs a read operation, wherein, when a second read command is applied to the at least one first memory chip and the at least one second memory chip, the at least one second memory chip performs a read operation, and wherein, when the first read command is applied, the at least one second memory chip ignores the first read command.

In an embodiment, a memory system may include: first memory chips configured to store data; at least one second memory chip configured to store a first error correction code generated based on the data; at least one third memory chip configured to store a second error correction code generated based on the data; and a memory controller configured to detect an error of the data based on the first error correction code, to apply an additional read command to access the at least one third memory chip when the error of the data is detected, and to correct the error of the data based on the second error correction code outputted from the at least one third memory chip in response to the additional read command.

In accordance with various embodiments of the present invention, it is possible to reduce current consumption while increasing the efficiency of error correction in a memory system.

These and other features and advantages of the present invention will become apparent to those skilled in the art of the invention from the following detailed description in conjunction with the following drawings.

DETAILED DESCRIPTION

Figure 1:
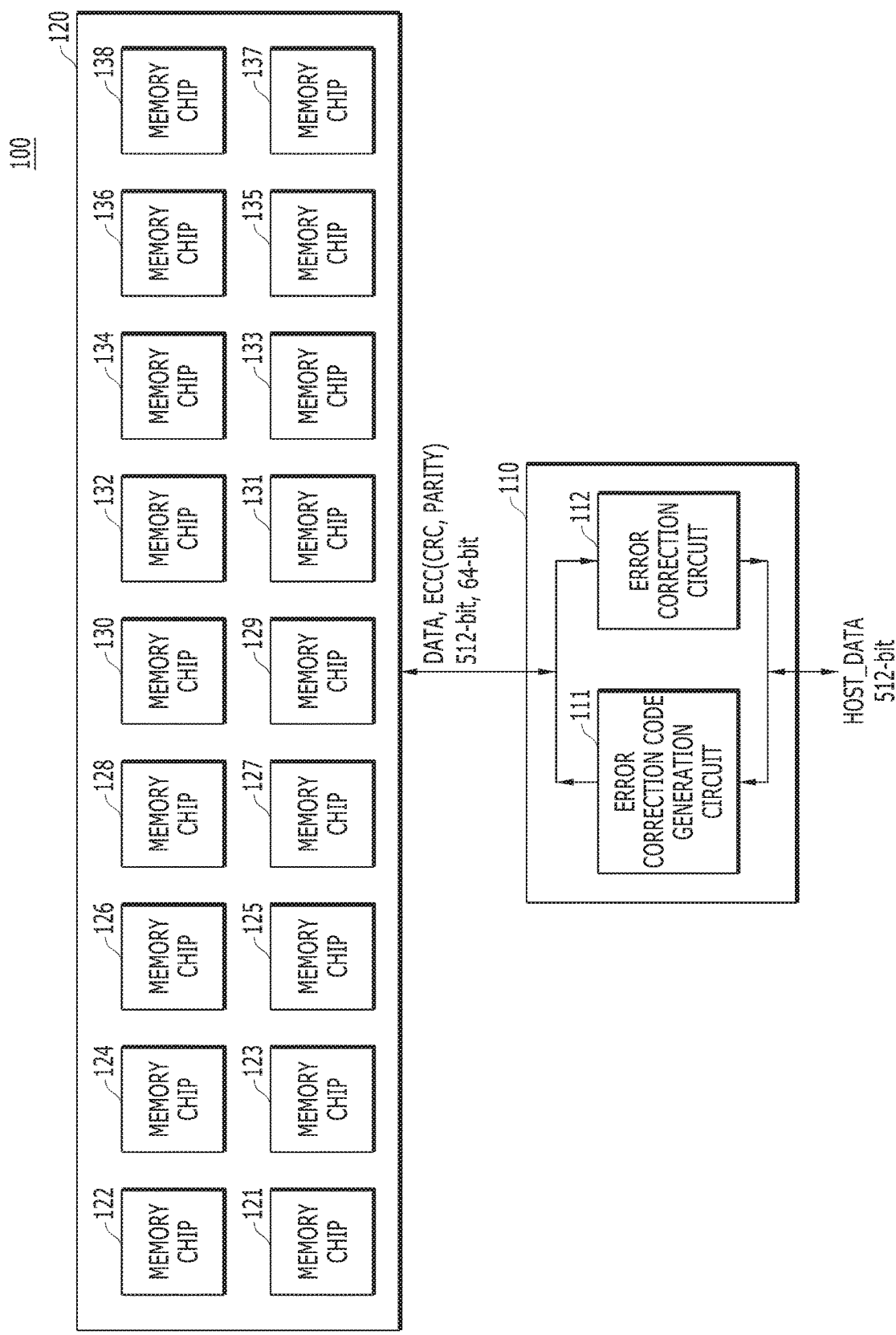
FIG. 1 is a diagram illustrating a memory system in accordance with an embodiment of the present invention.

Various embodiments of the present invention will be described below in more detail with reference to the accompanying drawings. The present invention may, however, be embodied in different other forms and should not be construed as being limited only to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

FIG. 1 is a diagram illustrating a memory system 100 in accordance with an embodiment of the present invention. It is noted that FIG. 1 illustrates only a part directly related to the storage and error correction of data in the memory system 100.

Referring to FIG. 1, the memory system 100 may include a memory controller 110 and a memory device 120 operatively coupled to each other.

The memory controller 110 may control the read and write operations of the memory device 120 according to a request of a host coupled to the memory system 100. The memory system may be embedded into the host or may be simply employed by the host. The link between the host and the memory system may be physical or wireless. The host together with the memory system 100 may also be referred to as a data processing system.

The memory controller 110 may include an error correction code generation circuit 111 and an error correction circuit 112. The error correction code generation circuit 111 may generate the error correction code (ECC) for correcting an error, based on data HOST_DATA transferred from the host during a write operation. FIG. 1 illustrates an example in which the unit of data processed during a one-time write operation, that is, the unit of a data word is 512 bits. For example, the error correction code generation circuit 111 may generate an error correction code (ECC) of 64 bits by using the 512-bit data HOST_DATA. In the error correction code (ECC) of 64 bits, 32 bits may be a cyclic redundancy check (CRC) code and the remaining 32 bits may be a simple parity code PARITY.

The error correction circuit 112 may correct an error of data DATA transferred from the memory device 120 based on an error correction code (ECC) read from the memory device 120 during the read operation.

The memory device 120 may include 18 memory chips 121 to 138. During the write operation, the memory chips 121 to 138 may store data DATA and an error correction code (ECC) transferred from the memory controller 110, and during the read operation, the data DATA and the error correction code (ECC) read from the memory chips 121 to 138 may be transferred from the memory device 120 to the memory controller 110. Each of the memory chips 121 to 138 may be one of all types of memories such as a dynamic random-access memory (DRAM), a phase change random access memory (PCRAM), and a flash memory. Although FIG. 1 illustrates that the memory device 120 is a dual in-line memory module (DIMM) type of memory module, the memory device 120 may be a memory module of another type other than the DIMM type, and may also include only one memory chip.

FIGS. 2 to 5 are diagrams describing an operation related to the error correction in the memory system 100 shown in FIG. 1.

Figure 2:
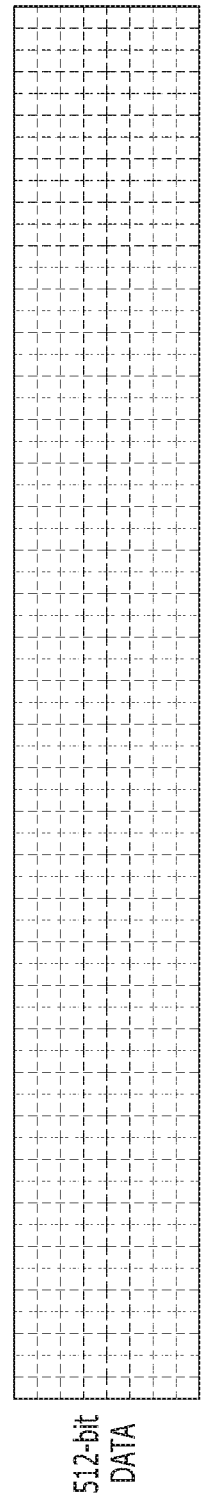
FIGS. 2 to 5 are diagrams describing an operation related to error correction in the memory system shown in FIG. 1.

FIG. 2 illustrates an exemplary structure of 512-bit data transferred from the host to the memory controller 110. In FIG. 2, the matrix consists of 512 squares indicated by dotted lines wherein each square corresponds to 1-bit of data.

Figure 3:
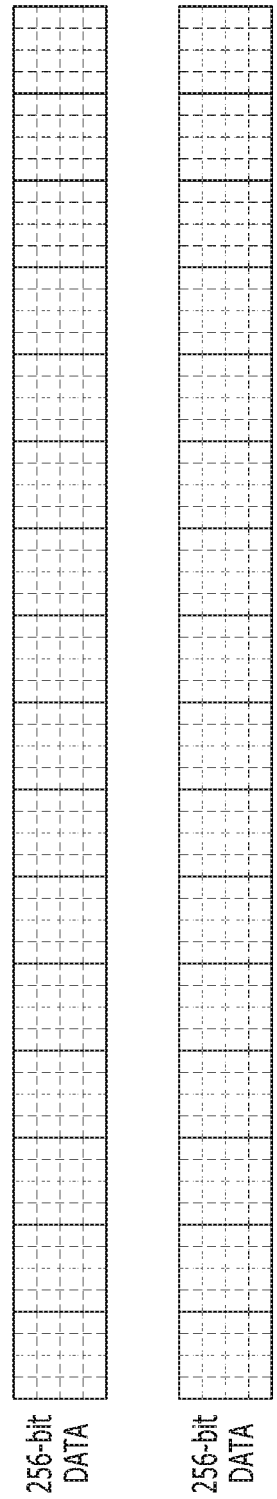

The error correction code generation circuit 111 may divide the 512-bit data received from the host into two groups each including 256-bit data as illustrated in FIG. 3, and further may divide each group into 16 symbols each of which includes 16-bit data. In FIG. 3, each of rectangles indicated by solid lines may represent one symbol, and each symbol may include 16-bit data.

Figure 4:
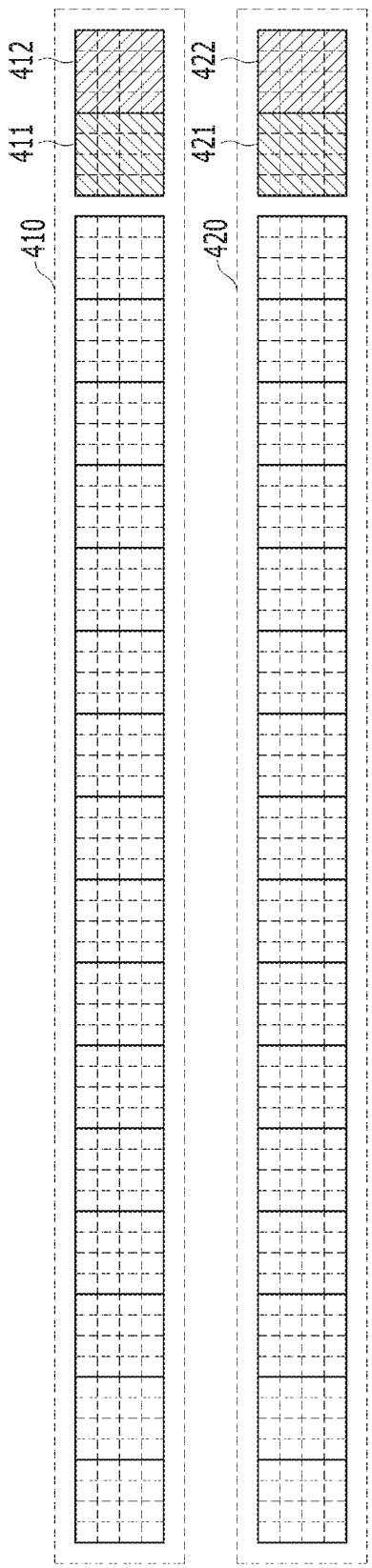

The error correction code generation circuit 111 may generate a 32-bit error correction code of two symbols 411 and 412 for the first 256-bit group and a 32-bit error correction code of two symbols 421 and 422 for the second 256-bit group as illustrated in FIG. 4. The symbol 411 of the first group may be a cyclic redundancy check (CRC) code generated using the 256-bit data of 16 symbols of the first group. Furthermore, the symbol 412 of the first group may be a simple parity code PARITY for data of the 16 symbols of the first group and a CRC code of one symbol. Specifically, the CRC code 411 may be a CRC-16 code and the simple parity code 412 may be generated by performing XOR operations on the data of the 16 symbols and the CRC code of the one symbol, that is, 17 symbols, by units of symbols. In FIG. 4, the CRC code 411 and the simple parity code 412 are indicated by hatching lines to distinguish them from the data. The data of the 16 symbols and the error correction codes 411 and 412 of the two symbols of the first group are referred to as a codeword which is denoted by '410'. The error correction code generation circuit 111 may generate the CRC code 421 of one symbol and the simple parity code 422 of one symbol for the second codeword 420 in the same manner. The codeword including the data of the 16 symbols and the error correction codes 421 and 422 of the two symbols of the second group is denoted by '420'.

Figure 5:
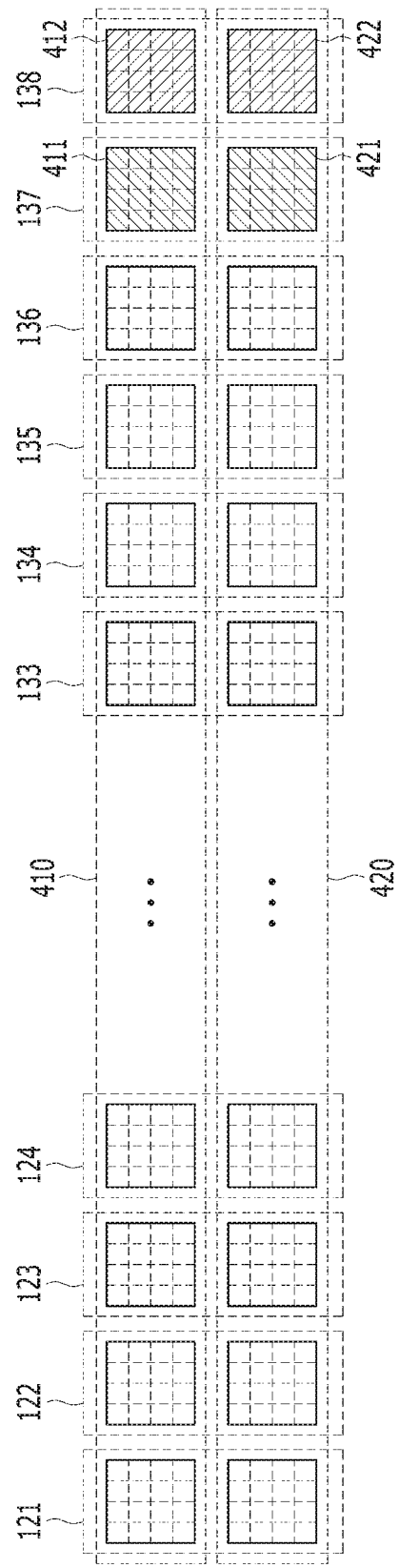

FIG. 5 is a diagram describing a method in which the codewords 410 and 420 are distributed and stored in the memory chips 121 to 138 of the memory device 120 shown in FIG. 1. Referring to FIG. 5, each of the memory chips 121 to 138 stores one symbol of the codeword 410 and one symbol of the codeword 420. For example, the memory chip 121 may store the first symbol of the codeword 410 and the first symbol of the codeword 420, and the memory chip 122 may store the second symbol of the codeword 410 and the second symbol of the codeword 420. In the same manner, the memory chip 137 may store the seventeenth symbol 411 of the codeword 410 and the seventeenth symbol 421 of the codeword 420, and the memory chip 138 may store the eighteenth symbol 412 of the codeword 410 and the eighteenth symbol 422 of the codeword 420.

The error correction circuit 112 may perform a separate error correction operation on each of the codewords 410 and 420. That is, the error correction circuit 112 may correct an error of the data of the codeword 410 based on the error correction code of the codeword 410, and correct an error of the data of the codeword 420 based on the error correction code of the codeword 420.

Hereinafter, a method in which the error correction circuit 112 corrects the error of the codeword 410 will be described. The error correction circuit 112 may correct an error of data by detecting the error by using the CRC code which is the seventeenth symbol 411 of the codeword 410, and restoring a symbol by using the simple parity code PARITY which is the eighteenth symbol 412.

More specifically the error correction method of the error of the codeword 410 may include operations 1 to 18 described below.

(Operation 1).

First, the error correction circuit 112 may detect the error of the codeword 410 by a CRC operation using the CRC code. When no error is detected, the error correction operation of the error correction circuit 112 may be terminated. When the error is detected, the error correction circuit 112 may perform operation 2 for correcting the error.

(Operation 2).

The error correction circuit 112 may restore the first symbol by using the simple parity code PARITY on the assumption that there is an error in the first symbol of the codeword 410, and may detect the error of the codeword 410 by using the CRC code. When no error is detected as a result of the error detection, the restored first symbol may replace the original first symbol and the error correction operation may be terminated. When error is detected as the result of the error detection, operation 3 may be performed.

(Operation 3).

The error correction circuit 112 may restore the second symbol by using the simple parity code PARITY on the assumption that there is an error in the second symbol of the codeword 410, and may detect the error of the codeword 410 by using the CRC code. When no error is detected as a result of the error detection, the restored second symbol may replace the original second symbol and the error correction operation may be terminated. When the error is detected as the result of the error detection, operation 4 may be performed.

(Operations 4 to 16).

Operations 4 to 16 may be performed in the same manner as operations 2 and 3.

(Operation 17).

The error correction circuit 112 may restore the sixteenth symbol by using the simple parity code PARITY on the assumption that there is an error in the sixteenth symbol of the codeword 410, and may detect the error of the codeword 410 by using the CRC code. When no error is detected as a result of the error detection, the restored sixteenth symbol may replace the original sixteenth symbol and the error correction operation may be terminated. When the error is detected as the result of the error detection, operation 18 may be performed.

(Operation 18).

The error correction circuit 112 may restore the seventeenth symbol by using the simple parity code PARITY on the assumption that there is an error in the seventeenth symbol of the codeword 410, that is, the CRC code, and may detect the error of the codeword 410 by using the restored CRC code. When no error is detected as a result of the error detection, the restored seventeenth symbol may replace the original seventeenth symbol and the error correction operation may be terminated. When the error is detected even in this process, the error correction operation of the error correction circuit 112 may be determined to fail.

Referring to the operations 1 to 18, it can be seen that the error correction circuit 112 uses the CRC code in operation 1 for detecting the error of the codeword 410 and uses the CRC code and the simple parity code PARITY in the operations 2 to 18 for detecting the error and then correcting the error.

An operation, in which the error correction circuit 112 detects an error of the codeword 420 and corrects the error, may also be performed in the same manner as in operations 1 to 18.

Figure 6:
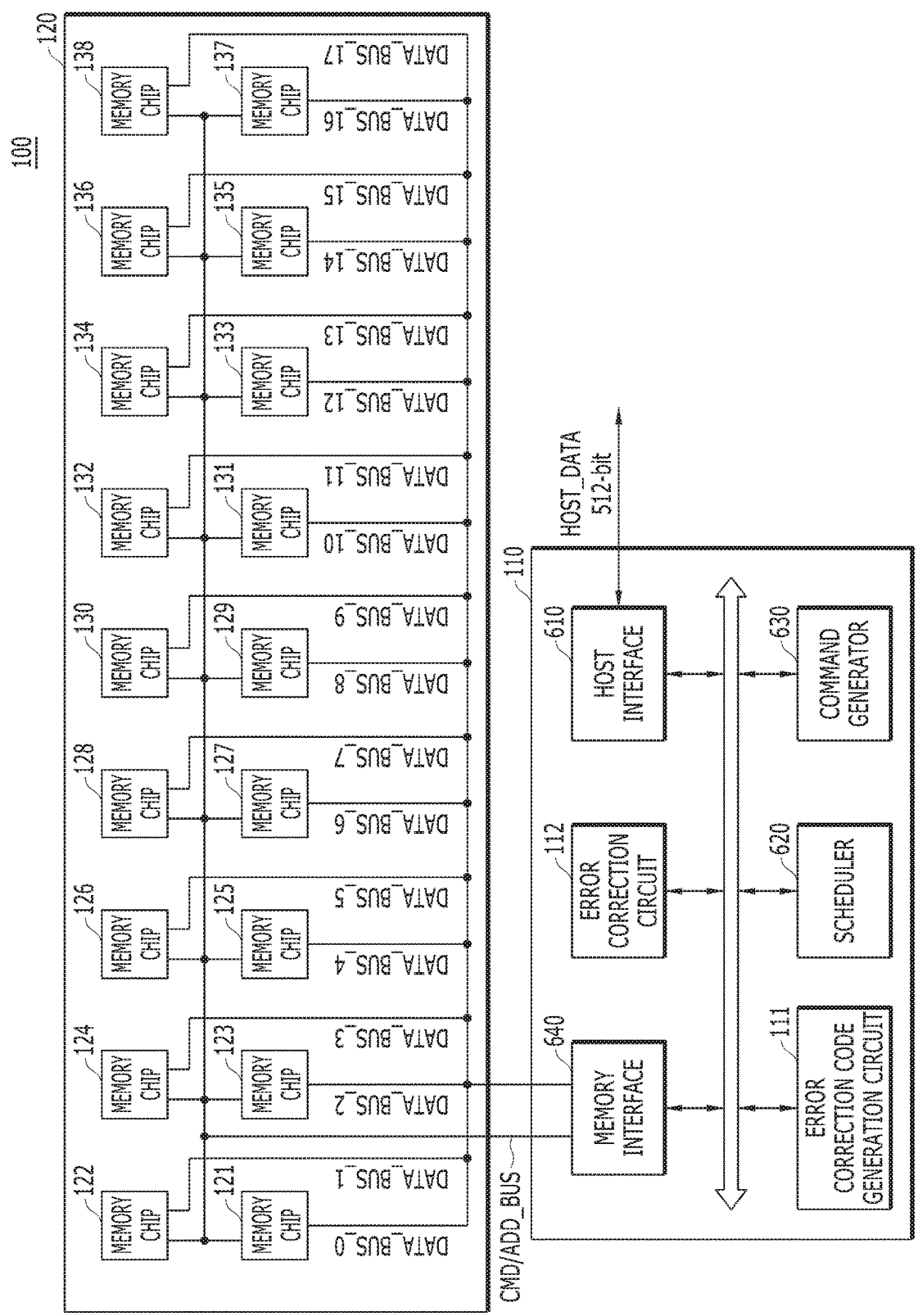
FIG. 6 is a more detailed diagram of the memory system shown in FIG. 1 in accordance with an embodiment of the present invention.

FIG. 6 is a detailed diagram of the memory system 100 shown in FIG. 1. In reference to FIG. 6, the operation of the memory system 100 will be described in more detail.

Referring to FIG. 6, commands and addresses may be transferred from the memory controller 110 to the memory device 120 through a command/address bus CMD/ADD_BUS, and data. Also, an error correction code (ECC) may be transferred between the memory controller 110 and the memory device 120 through data buses DATA_BUS_0 to DATA_BUS_17.

One command/address bus CMD/ADD_BUS may exist between the memory controller 110 and the memory device 120. This may indicate that the 18 memory chips 121 to 138 of the memory device 120 are controlled by a common command and a common address. Although not illustrated in the drawing, a clock may be transmitted from the memory controller 110 to the memory device 120, and the memory device 120 may include chips such as a register clock driver (RCD) for buffering a clock, a command, an address or the like on the command/address bus CMD/ADD_BUS for transferring the commands and the addresses between the memory controller 110 and the memory device 120.

For example, there may exist 18 independent data buses DATA_BUS_0 to DATA_BUS_17 between the memory controller 110 and the memory device 120. The 18 memory chips 121 to 138 of the memory device 120 may simultaneously transmit/receive data different from each other to/from the memory controller 110 by the 18 data buses DATA_BUS_0 to DATA_BUS_17. Although not illustrated in the drawing, the memory device 120 may include buffering chips for buffering data on the data buses DATA_BUS_0 to DATA_BUS_17.

Among the memory chips 121 to 138 of the memory device 120, the memory chip 138 for storing the error correction code (for example, the simple parity) used only for error correction may be set to ignore a first read command among the first read command and a second read command. The first read command and the second read command may be substantially the same command, and may be distinguished from each other by a flag signal (e.g., a specific address bit). For example, when a read command is instructed through a command transferred through the command/address bus CMD/ADD_BUS, when a specific address bit not used during a read operation is '1' among multi-bit address signals included in an address transferred through the command/address bus CMD/ADD_BUS, the read command may be the second read command, and when the specific address bit not used during the read operation is '0', the read command may be the first read command. In order to distinguish the first read command from the second read command, it may be possible to use various methods such as using another signal other than the specific address bit or allowing commands corresponding to the first read command and the second read command to be different from each other. Alternatively, an operation mode set may also be used as a method for distinguishing the first read command from the second read command. For example, in a state in which the mode of the memory chips 121 to 138 have been set to a first mode, when a read command is applied to the memory chips 121 to 138, the memory chips 121 to 138 may recognize the read command as the first read command. In a state in which the mode of the memory chips 121 to 138 have been set to a second mode, when a read command is applied to the memory chips 121 to 138, the memory chips 121 to 138 may recognize the read command as the second read command.

As a method in which only the memory chip 138 of the memory chips 121 to 138 is set to ignore the second read command, it may be possible to use various methods such as using a per DRAM addressability (PDA) mode.

Since the memory chip 138 is set to ignore the first read command among a large number of types of commands, the memory chip 138 may recognize an active command, a precharge command, a refresh command, a write command or the like in the same way as in the other memory chips 121 to 137 and may perform substantially the same operations as those of the other memory chips 121 to 137.

The memory controller 110 may include the error correction code generation circuit 111 and the error correction circuit 112 shown in FIG. 1. In addition, the memory controller 110 may further include a host interface 610, a scheduler 620, a command generator 630, and a memory interface 640.

Since the error correction code generation circuit 111 and the error correction circuit 112 have been described in detail in FIGS. 1 to 5, a more detailed description thereof will be omitted herein.

The host interface 610 may be provided for an interface between the memory controller 110 and the host. Requests of the host may be received through the host interface 610 and processing results of the requests may be transmitted to the host. Although various types of information may be transmitted/received between the memory controller 110 and the host through the host interface 610, FIG. 6 illustrates only the data HOST_DATA directly related to the present disclosure among various types of information transmitted/received between the host and the memory controller 110.

The scheduler 620 may determine an order of requests to be directed to the memory device 120 among the requests from the host. In order to improve the performance of the memory device 120, the scheduler 620 may allow an order in which the requests are received from the host HOST to be different from an order of operations to be directed to the memory device 120. For example, even though the host requests a read operation of the memory device 120 and then requests a write operation, the scheduler 620 may adjust an order such that the write operation is performed before the read operation is performed. Meanwhile, when an error is detected by the error correction circuit 112 during a first read operation by the first read command, the scheduler 620 may schedule a second read operation by the second read command.

The command generator 630 may generate commands to be applied to the memory device 120 according to the order of operations determined by the scheduler 620.

The memory interface 640 may be provided for an interface between the memory controller 110 and the memory device 120. Through the memory interface 640, commands and addresses may be transferred from the memory controller 110 to the memory device 120, and data may be transmitted/received therebetween. The memory interface 640 may transfer commands and addresses to the memory chips 121 to 138 through the command/address bus CMD/ADD_BUS, and may transmit/receive data to/from the memory chips 121 to 138 through the data buses DATA_BUS_0 to DATA_BUS_17.

Figure 7:
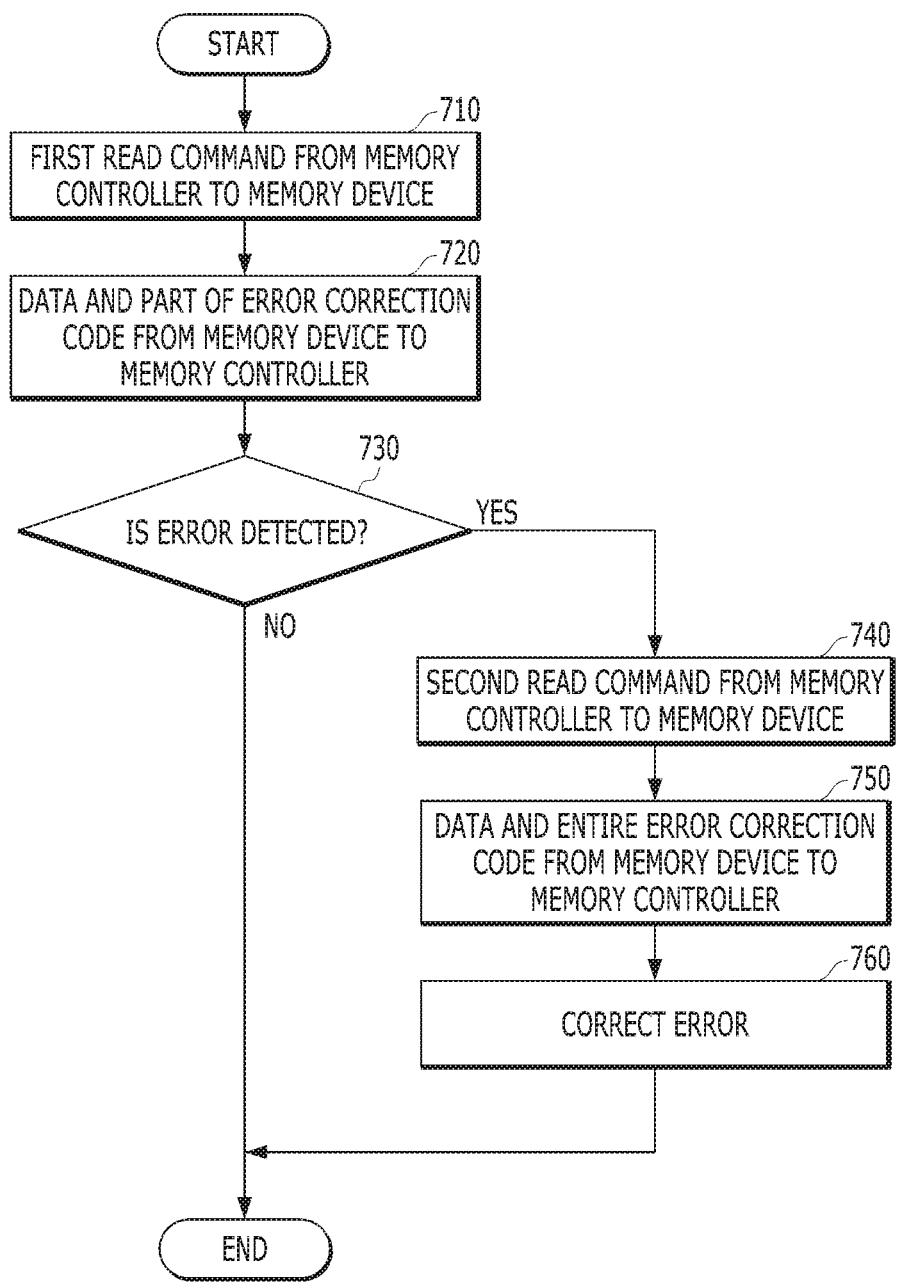
FIG. 7 is a flow chart describing a read operation of memory system in accordance with an embodiment of the present invention.

FIG. 7 is a flow chart describing a read operation of the memory system 100 shown in FIG. 6.

Referring to FIG. 7, the first read command may be transferred from the memory controller 110 to the memory device 120 at step 710. An address for designating a region to be read may be transferred together with the first read command. The first read command and the address may be transferred to the memory chips 121 to 138 of the memory device 120 through the command/address bus CMD/ADD_BUS.

In response to the first read command, data DATA and a part of an error correction code (ECC) corresponding to the data DATA may be transferred from the memory device 120 to the memory controller 110 at step 720. Since the memory chips 121 to 137 perform the read operation by the first read command but the memory chip 138 ignores the first read command, the data DATA and the part (for example, the CRC code) of the error correction code (ECC) stored in the memory chips 121 to 137 may be transferred from the memory device 120 to the memory controller 110. The part of the error correction code (ECC) may be a part required for detecting an error of data in the entire error correction code (ECC).

The error correction circuit 112 of the memory controller 110 may detect an error of the data DATA by using the part of the error correction code (ECC) at step 730. The error detection of the error correction circuit 112 may be performed in the same manner as in the aforementioned method of (1). When the error is not detected (i.e., in case of "NO" in step 730), the read operation may be terminated. Since error non-detection probability is much higher than error detection probability, only steps 710, 720, and 730 are performed and the read operation may be terminated in most cases.

When the error is detected by the error correction circuit 112 (i.e., in case of "YES" in step 730), the second read command may be transferred from the memory controller 110 to the memory device 120 at step 740. Since a read operation by the second read command is an operation for correcting the error detected in step 730, an address transferred to the memory device 120 together with the second read command may be substantially the same as the address in step 710 except for a specific bit to be used as a flag signal to distinguish the first read command and the second read command from each other. The second read command and the address may be transferred to the memory chips 121 to 138 of the memory device 120 through the command/address bus CMD/ADD_BUS.

In response to the second read command, data and an error correction code (ECC) corresponding to the data may be transferred from the memory device 120 to the memory controller 110 at step 750. Since the memory chip 138 as well as the memory chips 121 to 137 perform the read operation by the second read command, the read operation is performed in all the memory chips 121 to 138 of the memory device 120, so that the data DATA and the error correction code (ECC) may be transferred from the memory device 120 to the memory controller 110. Although the memory chips 121 to 137 also perform the read operation in response to the second read command, the memory chips 121 to 137 may also be designed to ignore the second read command. This is because the data DATA and the error correction code (ECC) stored in the memory chips 121 to 137 have already been transferred to the memory controller 110 during the read operation by the first read command, that is, step 720.

The error correction circuit 112 of the memory controller 110 may correct the error of the data DATA by using the error correction code (ECC) at step 760. Since the data and the entire error correction code have been received in the read operation by the second read command, the error correction circuit 112 may correct the error of the data. The error correction operation of the error correction circuit 112 may be performed in the same manner as in the aforementioned operations 2 to 18. The read operation may be terminated by correcting the error of the read data by the error correction circuit 112.

Referring to FIG. 7, it can be seen that when error is not detected by the error correction circuit 112 in the read operation by the first read command, the read operation is terminated, and when error is detected by the error correction circuit 112 in the read operation by the first read command, the read operation by the second read command is additionally performed.

During the read operation by the first read command, since the read operation is performed only in the memory chips 121 to 137 of the memory chips 121 to 138 of the memory device 120 and is not performed in the memory chip 138, the current consumption of the memory system 100 may be reduced. During the read operation of the memory system 100, error detection probability is very low. For example, an error may be detected about once in several hundreds to several thousands of read operations. In most cases, only the read operation by the first read command is performed in the memory system 100, so that it is possible to reduce the current consumption of the read operation of the memory system 100.

Although the aforementioned embodiments have described an example in which the memory device 120 includes the plurality of memory chips 121 to 138 and the memory chip 138 for storing the error correction code used only for error correction among the memory chips 121 to 138 ignores the first read command, the present disclosure can be applied to other cases. For example, even though the memory device 120 includes only one memory chip, the memory chip is designed such that a part of the error correction code and data are read from the one memory chip when the first read command is applied thereto and the entire error correction code and data are read from the one memory chip when the second read command is applied thereto, so that it is possible to reduce the current consumption of the read operation.

Although various embodiments have been described for illustrative purposes, it will be apparent to those skilled in the art that various changes and modifications may be made without departing from the spirit and scope of the invention as defined in the following claims.

What is claimed is:

1. An operation method of a memory system including a memory controller and a memory device, the operation method comprising:
transferring, by the memory controller, a first read command to the memory device;
transferring, by the memory device, read data and a part of an error correction code corresponding to the read data to the memory controller in response to the first read command;
detecting, by the memory controller, an error of the read data based on the part of the error correction code;
transferring, by the memory controller, a second read command to the memory device when the error is detected;
transferring, by the memory device, a remainder of the error correction code corresponding to the read data to the memory controller in response to the second read command; and
correcting, by the memory controller, the error of the read data based on the remainder of the error correction code.

2. The operation method of claim 1, wherein, in the correcting of the error, the part of the error correction code is further used together with the remainder of the error correction code.

3. The operation method of claim 2, wherein, in the transferring of the remainder of the error correction code, the read data are further transferred in addition to the part of the error correction code.

4. The operation method of claim 3, wherein, in the transferring of the remainder of the error correction code, the part of the error correction code is used to detect the error of the read data, and the remainder of the error correction code is used to correct the error of the read data in the error correction code.

5. The operation method of claim 1, wherein the part of the error correction code is a cyclic redundancy check (CRC) code, and the remainder of the error correction code is a simple parity code.

6. The operation method of claim 1, wherein the memory device is a memory module including a plurality of memory chips,
at least one first memory chip of the plurality of memory chips stores the read data and the part of the error correction code, and
at least one second memory chip of the plurality of memory chips stores the remainder of the error correction code.

7. The operation method of claim 6, wherein the at least one second memory chip ignores the first read command.

8. The operation method of claim 6, wherein a flag signal is transferred to the memory device through a specific address bit when the first read command is transferred to the memory device.

9. A memory system comprising:
a memory device configured to output read data and a part of an error correction code corresponding to the read data in response to a first read command, and to output a remainder of the error correction code corresponding to the same read data in response to a second read command; and
a memory controller configured to detect an error of the read data based on the part of the error correction code outputted from the memory device corresponding to the first read command, and to apply the second read command to the memory device when the error is detected.

10. The memory system of claim 9, wherein the memory controller corrects the error of the read data based on the remainder of the error correction code outputted from the memory device corresponding to the second read command.

11. The memory system of claim 10, wherein the memory controller uses the part of the error correction code together with the remainder of the error correction code when correcting the error of the read data.

12. The memory system of claim 10, wherein, when the second read command is applied, the memory device further outputs the read data and the part of the error correction code corresponding to the read data in addition to the remainder of the error correction code.

13. The memory system of claim 10, wherein the memory controller comprises:
an error correction code generation circuit configured to generate an error correction code to be stored with write data based on the write data during a write operation; and
an error correction circuit configured to detect the error of the read data based on the part of the error correction code received from the memory device corresponding to the first read command, and to correct the error of the read data based on the remainder of the error correction code received from the memory device corresponding to the second read command.

14. The memory system of claim 13, wherein the memory controller further comprises:
a scheduler configured to schedule a second read operation by the second read command when the error of the read data is detected by the error correction circuit.

15. The memory system of claim 10, wherein the memory device is a memory module including a plurality of memory chips,
wherein, at least one first memory chip of the plurality of memory chips stores the read data and the part of the error correction code, and
wherein, at least one second memory chip of the plurality of memory chips stores the remainder of the error correction code.

16. The memory system of claim 15, wherein the at least one second memory chip ignores the first read command.

17. The memory system of claim 16, wherein a flag signal is applied to the memory device through a specific address bit when the first read command is applied to the memory device.

18. The memory system of claim 9, wherein the part of the error correction code is a cyclic redundancy check (CRC) code, and the remainder of the error correction code is a simple parity code.

19. A memory module comprising:
at least one first memory chip configured to store data and a part of an error correction code corresponding to the data; and
at least one second memory chip configured to store a remainder of the error correction code corresponding to the data,
wherein the at least one first memory chip and the at least one second memory chip share a command,
wherein, when a first read command is applied to the at least one first memory chip and the at least one second memory chip, the at least one first memory chip performs a read operation,
wherein, when a second read command is applied to the at least one first memory chip and the at least one second memory chip, the at least one second memory chip performs a read operation, and
wherein, when the first read command is applied, the at least one second memory chip ignores the first read command.

20. The memory module of claim 19, wherein the part of the error correction code is a cyclic redundancy check (CRC) code, and the remainder of the error correction code is a simple parity code.

21. A memory system comprising:
first memory chips configured to store data;
at least one second memory chip configured to store a first error correction code generated based on the data;
at least one third memory chip configured to store a second error correction code generated based on the data; and
a memory controller configured to detect an error of the data based on the first error correction code, to apply an additional read command to access the at least one third memory chip when the error of the data is detected, and to correct the error of the data based on the second error correction code outputted from the at least one third memory chip in response to the additional read command.

22. The memory system of claim 20, wherein the first error correction code is a cyclic redundancy check (CRC) code, and the second error correction code is a simple parity code.

* * * * *